(12) United States Patent
Ma

(10) Patent No.: US 11,520,433 B2
(45) Date of Patent: Dec. 6, 2022

(54) TOUCH CONTROL STRUCTURE HAVING METAL WIRINGS MOUNTED AROUND A FUNCTIONAL MODULE, AND DISPLAY PANEL AND DISPLAY DEVICE USING THE SAME

(71) Applicant: Wuhan China Star Optoelectronics Semiconductor Display Technology Co., Ltd., Wuhan (CN)

(72) Inventor: Liang Ma, Wuhan (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 16/476,280

(22) PCT Filed: Mar. 25, 2019

(86) PCT No.: PCT/CN2019/079405
§ 371 (c)(1),
(2) Date: Jul. 6, 2019

(87) PCT Pub. No.: WO2020/133746
PCT Pub. Date: Jul. 2, 2020

(65) Prior Publication Data
US 2021/0357093 A1    Nov. 18, 2021

(30) Foreign Application Priority Data

Dec. 27, 2018 (CN) .......................... 201811615628.7

(51) Int. Cl.
*G06F 3/041* (2006.01)
*H01L 27/32* (2006.01)
(52) U.S. Cl.
CPC ........ *G06F 3/04164* (2019.05); *G06F 3/0412* (2013.01); *H01L 27/3276* (2013.01)
(58) Field of Classification Search
CPC . G06F 3/04164; G06F 3/0412; H01L 27/3276
See application file for complete search history.

(56) References Cited

U.S. PATENT DOCUMENTS

2014/0198266 A1   7/2014 Park et al.
2017/0294502 A1*  10/2017 Ka ...................... H01L 27/3258
(Continued)

FOREIGN PATENT DOCUMENTS

CN   102419655 A   4/2012
CN   204155235 U   2/2015
(Continued)

*Primary Examiner* — Darlene M Ritchie
(74) *Attorney, Agent, or Firm* — PV IP PC; Wei Te Chung; Ude Lu

(57) ABSTRACT

A touch control structure, and a display panel and a display device using the same are provided. The advantage is that an area of a first region which is blocked by metal wirings extending through the first region is less than an area of a second region which is blocked by metal wirings extending through the second region. Therefore, light transmittance in the first region is larger than light transmittance in the second region. A module that needs sufficient visible light can be disposed on a location corresponding to the first region to improve performance of the module.

10 Claims, 2 Drawing Sheets

(56) References Cited

U.S. PATENT DOCUMENTS

2019/0089880 A1\* 3/2019 Murao .................... B60R 11/04
2019/0121211 A1\* 4/2019 Luo ..................... H01L 27/3276
2020/0066809 A1 2/2020 Liu

FOREIGN PATENT DOCUMENTS

| CN | 108257514 | A |   | 7/2018 | |
|----|-----------|---|---|--------|--------------|
| CN | 207636882 | U | \* | 7/2018 | ........... G01F 1/1333 |
| CN | 207636882 | U |   | 7/2018 | |
| CN | 108461521 | A |   | 8/2018 | |
| WO | 2009041609 | A1 |   | 4/2009 | |

\* cited by examiner

TOUCH CONTROL STRUCTURE HAVING METAL WIRINGS MOUNTED AROUND A FUNCTIONAL MODULE, AND DISPLAY PANEL AND DISPLAY DEVICE USING THE SAME

FIELD OF INVENTION

The present invention relates to a field of touch display, and, in particular, to a touch control structure, and a display panel and a display device using the same.

BACKGROUND OF INVENTION

As a concept of full-screen panel is deeply rooted in the hearts of the people, display devices with high screen-to-body ratio have become a goal of display manufacturers. However, full-screen technology still faces many challenges. Although an under-screen fingerprint, a built-in light sensing, and an earpiece technology enable the "hidden" design of a microphone, earpiece, proximity sensor, and Home button, an under-screen camera technology still can't satisfy users' requirement due to extremely low light transmittance of an array substrate, an OLED film layer, or a display film layer. For instance, in an OLED display panel, since light needs to pass through a cover glass, a polarizer (POL), a touch layer, an organic array layer (an electroluminescent layer and thin film encapsulation), and an organic layer of an array substrate or an inorganic layer of an array substrate to reach a camera, the light will be attenuated. Although light attenuation can be slightly improved by optimizing imaging algorithms, the response rate of a camera will be seriously affected and cannot satisfy a commercial requirement. In addition, an opening can be defined in a display region of a display panel to enable the light to reach camera; however, such a manner will leave a circular non-display region in the display region, which affects the quality of the display panel. Therefore, the under-screen camera technology becomes a bottleneck for a panel to attain a full-screen design.

Technical Problem

As the screen integration improves, the in-cell touch technology gradually matures, thereby making a thickness of an OLED display panel become thinner and thinner. However, metal wirings in a conventional touch area of an OLED display panel also bring reflection and diffraction of light for a camera area under a screen of an OLED display panel under a screen, which causes negative effects such as glare and also reduces the transmittance of the light. Conclusively, in order to really realize a camera positioned under a screen, a new design of wiring layout for an in-cell touch control is required.

SUMMARY OF INVENTION

The present invention provides a touch control structure, and a display panel and a display device using the touch control structure, which can increase light transmittance in a demand area.

To solve the above problem, the present invention provides a touch control structure including a plurality of metal wirings and a plurality of touch electrodes. The metal wirings are disposed crossing each other and are electrically insulated from each other. Each metal wiring is electrically connected with corresponding electrodes. The touch control structure further comprises at least one first region and at least one second region disposed outside the first region. A density of the metal wirings extending through the first region is less than a density of the metal wirings extending through the second region.

In one embodiment, at least some of the metal wirings are curved to bypass the first region, thereby making a density of the metal wirings extending through the first region less than a density of the metal wirings extending through the second region.

In one embodiment, at least some of the curved portions of the curved metal wirings are disposed symmetrically relative to the first region.

In one embodiment, at least some of the metal wirings are arcuate to bypass the first region, thereby making a density of the metal wirings extending through the first region less than a density of the metal wirings extending through the second region.

In one embodiment, all of the metal wirings are curved to bypass the first region, thereby making a density of the metal wirings extending through the first region less than a density of the metal wirings extending through the second region.

To solve the above problem, the present invention also provides a display panel including the touch control structure. The first region is corresponding to a function module area of the display panel.

In one embodiment, the display panel includes a plurality of light-emitting units, and a density of the light-emitting units located in the function module area is less than a density of the light-emitting units located in an area outside the function module area.

In one embodiment, a non-light-emitting side of the display panel is provided with a function module, and the function module is corresponding to the function module area.

In one embodiment, the function module is a camera component.

In one embodiment, the metal wirings are disposed at locations corresponding to gaps among the light-emitting units.

In one embodiment, at least some of the metal wirings are curved to bypass the first region, thereby making a density of the metal wirings extending through the first region less than a density of the metal wirings extending through the second region.

In one embodiment, at least some of the curved portions of the curved metal wirings are disposed symmetrically relative to the first region.

In one embodiment, at least some of the metal wirings are arcuate to bypass the first region, thereby making a density of the metal wirings extending through the first region less than a density of the metal wirings extending through the second region.

In one embodiment, all of the metal wirings are curved to bypass the first region, thereby making a density of the metal wirings extending through the first region less than a density of the metal wirings extending through the second region.

To solve the above problem, the present invention also provides a display device including the touch control structure.

In one embodiment, at least some of the metal wirings are curved to bypass the first region, thereby making a density of the metal wirings extending through the first region less than a density of the metal wirings extending through the second region.

In one embodiment, at least some of the curved portions of the metal wirings are disposed symmetrically relative to the first region.

In one embodiment, at least some of the metal wirings are arcuate to bypass the first region, thereby making a density of the metal wirings extending through the first region less than a density of the metal wirings extending through the second region.

In one embodiment, at least all of the metal wirings are curved to bypass the first region, thereby making a density of the metal wirings extending through the first region less than a density of the metal wirings extending through the second region.

In one embodiment, the display device also includes the display panel.

Advantageous Effects

The metal wirings extending through the first region of the touch control structure are less than the metal wirings extending through the second region of the touch control structure. An area that the metal wirings block the first region is reduced, thereby making light transmittance in the first region larger than light transmittance in the second region. When the touch control structure is applied to a display panel or a display device, a module that needs sufficient visible light can be disposed at a location corresponding to the first region to improve performance of the module.

DETAILED DESCRIPTION OF PREFERRED EMBODIMENTS

The description of a touch control structure, and a display panel, and a display device using the touch control structure will be illustrated in detail below with reference to the accompanying drawings.

Figure 1:
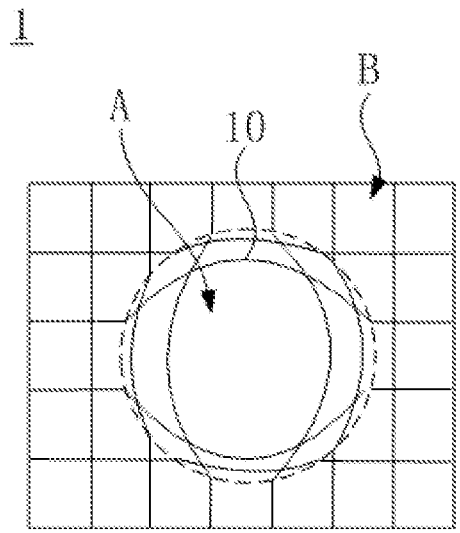
FIG. 1 is a top plan view of the touch control structure according to the present invention.

FIG. 1 is a top plan view of the touch control structure according to the present invention. As shown in FIG. 1, the touch control structure 1 includes a plurality of metal wirings 10 and a plurality of touch control electrodes. Each metal wiring 10 is electrically connected with corresponding electrodes. Since the present invention mainly describes the structure of a wiring layer, the touch electrodes are not shown in the drawings. The touch control structure is electrically connected to a touch control chip (not shown) through the metal wirings 10, thereby making a signal be able to be transmitted to the touch control chip. Specifically, a metal wiring 10 is electrically connected to a touch control electrode. The metal wiring 10 is made of opaque, conductive materials, such as a Ti/Al/Ti laminate structure, and the touch electrode is made of a transparent conductive material, such as Indium Tin Oxide (ITO). Therefore, the metal wirings 10 will block visible light from passing through the touch control structure at a location corresponding to the metal wirings 10.

The touch control structure 1 includes at least one first region A and at least one second region B disposed outside the first region A. The first region A and the second region B are only schematically illustrated in the drawings, which only represent the relatively positional relationship between the first region A and the second region B. The sizes of the first region A and the second region B are not specifically limited. Specifically, all or part of an area of the touch control structure 1 outside the first region A is defined as the second region B. In this embodiment, a first region A is schematically illustrated, and an area surrounding the first area A is a second region B. In other embodiments of the present invention, the touch control structure 1 can also be divided into a plurality of first regions A, and an area outside the first regions A is the second region B. The first region A can be disposed on any position of the touch control structure 1. For example, the first region A is disposed on an upper end, a lower end, or a middle of the touch control structure 1, which is not limited by the present invention.

A density of the metal wirings 10 extending through the first region A is less than a density of the metal wirings 10 extending through the second region B. An area that the metal wirings 10 block the first region A is reduced, thereby making light transmittance in the first region A larger than light transmittance in the second region B. When a touch control structure is applied to a display panel or a display device, a module that needs sufficient visible light can be disposed at a corresponding position of the first region A to improve performance of the module.

At least some of the metal wirings 10 are curved to bypass the first region A, thereby making a density of the metal wirings 10 extending through the first region A less than a density of the metal wirings 10 extending through the second region B. Specifically, all of the metal wirings 10 extend in a horizontal or vertical direction in the touch control structure 1. When some of the metal wirings 10 extend through the first region A, the metal wirings 10 in the first region A are curved toward the periphery of the first region A. Therefore, the metal wirings 10 in the first region A will not extend through a central region of the first region A, and the metal wirings 10 in the first region will not block the central region of the first region A. The metal wirings 10 in the first region can be curved in an arc shape or can be curved in other shapes, which is not limited in the present invention. Since the number of the metal wirings 10 extending through the central region of the first region A is reduced, an area that the first region A blocked by the metal wirings 10 is less than an area that the second region B blocked by the metal wirings 10, thereby making light transmittance in the first region A larger than light transmittance in the second region B.

In the present embodiment, all of the metal wirings 10 are curved to bypass the first region A. Specifically, all of the metal wirings 10 are curved to bypass the central region of the first region A, thereby making a density of the metal wirings 10 extending through the first region A less than a density of the metal wirings 10 extending through the second region B. That is, in this embodiment, all of the metal wirings 10 do not extend through the first region A, or at least do not extend through the central region of the first region A, after the metal wirings 10 are curved. As a result, the first region A is not blocked by the metal wirings 10, and light transmittance in the first region A is significantly increased.

Furthermore, in this embodiment, at least some of the curved portions of the metal wirings 10 are symmetrically disposed relative to the first region A. For example, the curved portions of the metal wirings 10 are bilaterally symmetrical or vertically symmetrical. More specifically, as shown in FIG. 1, some of the curved portions of the metal wirings 10 are vertically symmetrical curved to bypass the first region A.

It should be noted that the touch control structure of the present invention is focused on a wiring design of a touch control structure. Other structures of the touch control structure are conventional structures in the art and are not described again.

Figure 2:
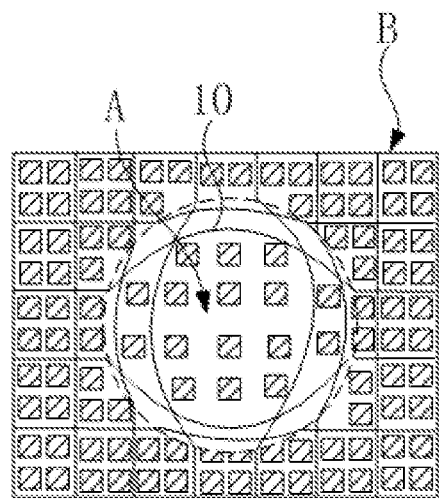
FIG. 2 is a top plan view of the display panel according to the present invention.
Figure 3:
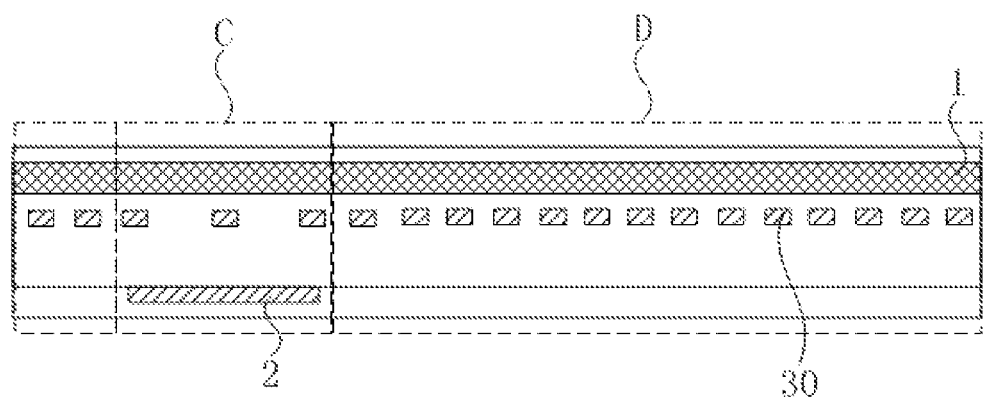
FIG. 3 is a schematic cross-sectional view of the display panel according to the present invention.

The present invention provides a display panel. Specifically, the present invention provides an in-cell type display panel. The display panel includes but is not limited to an organic light-emitting diode (OLED) display panel and a liquid crystal display (LCD) display panel. In this embodiment, the OLED display panel is taken as an example for description. FIG. 2 is a top plan view of the display panel, and FIG. 3 is a schematic cross-sectional view of the display panel. As shown in FIG. 2 and FIG. 3, the display panel includes the touch control structure 1. The first region A of the touch control structure 1 is corresponding to a function module C. The second region B of the touch control structure is corresponding to a location outside the function module C. The location outside the function module C is defined as a non-function module D. The function module C is a location where the display panel needs to set the function module 2. In this embodiment, the function module 2 is a camera component, an imaging area of the camera component is corresponding to the central region of the first region A. Since light transmittance in the first region A is large, visible light reaching the camera component is greatly increased, thereby improving the imaging quality of the camera component. In other embodiments of the present invention, the function module 2 can also be other function modules used in the display panel that need visible light.

Furthermore, the function module 2 is disposed on a non-light-emitting side. In other words, the function module 2 is disposed on one side of the display panel away from the touch control structure 1. The function module 2 is corresponding to the function module C.

The display panel includes a plurality of light-emitting units 30. A density of the light-emitting units 30 located in the function module C is less than a density of the light-emitting units 30 located in the non-function module D. Therefore, an area that the light-emitting units 30 block the function module C is reduced, and light transmittance in the function module C is increased. As a result, visible light reaching the camera component is greatly increased, and the imaging quality of the camera component is significantly improved. The metal wirings 10 of the touch control structure 1 are disposed at locations corresponding to gaps among the light-emitting units 30 to prevent light emitted by the light-emitting units 30 from being blocked by the metal wirings 10.

The present invention also provides a display device. The touch control structure or the display panel is applied to the display device. The display device of the present invention can be applied to a mobile terminal or a fixed terminal. For instance, the mobile terminal includes a mobile phone, a tablet computer, a personal digital assistant PDA, a POS (Point of Sales) used in a sales terminal, and a car computer. The fixed terminal includes a television, a computer, a touch control device and testing equipment.

The above description is only a preferred embodiment of the present invention. It should be noted that those skilled in the art can also achieve several improvements and modifications without departing from the principles of the present invention. These improvements and modifications should also be considered as protection of the present invention.

INDUSTRIAL APPLICABILITY

The present invention can be manufactured and used in the industry, so it possesses industrial practicability.

What is claimed is:

1. A display panel, comprising:
a touch control structure, comprising: a plurality of metal wirings, wherein the metal wirings are disposed crossing each other and are electrically insulated from each other; a plurality of touch electrodes, wherein each metal wiring is electrically connected with corresponding electrodes; at least one first region; and at least one second region disposed outside the first region, wherein at least some of the metal wirings are arcuate to bypass the first region, thereby making a density of the metal wirings extending through the first region less than a density of the metal wirings extending through the second region, and wherein the first region is corresponding to a function module area of the display panel and comprises non-uniformly dispersed light-emitting units; and
a density of the light-emitting units located in the function module area is less than a density of the light-emitting units located in an area outside the function module area, and wherein the metal wirings are disposed at locations corresponding to gaps among the light-emitting units.

2. The display panel of claim 1, wherein at least some of the metal wirings are curved to bypass the first region, thereby making a density of the metal wirings extending through the first region less than a density of the metal wirings extending through the second region.

3. The display panel of claim 1, wherein at least some of the curved portions of the metal wirings are disposed symmetrically relative to the first region.

4. The display panel of claim 1, wherein all of the metal wirings are curved to bypass the first region, thereby making a density of the metal wirings passing through the first region less than a density of the metal wirings passing through the second region.

5. The display panel of claim 1, wherein a non-light-emitting side of the display panel is provided with a function module, and the function module is corresponding to the function module area.

6. The display panel of claim 5, wherein the function module is a camera component.

7. A display device, comprising:
the display panel in claim 1.

8. The display device of claim 7, wherein at least some of the metal wirings are curved to bypass the first region, thereby making a density of the metal wirings extending through the first region less than a density of the metal wirings extending through the second region.

9. The display device of claim 7, wherein at least some of the curved portion of the metal wirings are disposed symmetrically relative to the first region.

10. The display device of claim 7, wherein all of the metal wirings are curved to bypass the first region, thereby making a density of the metal wirings extending through the first region less than a density of the metal wirings extending through the second region.

* * * * *